US011067638B2

(12) United States Patent
Kratochvil et al.

(10) Patent No.: US 11,067,638 B2
(45) Date of Patent: Jul. 20, 2021

(54) METHOD OF AND SYSTEM FOR DETECTING A SERIAL ARC FAULT IN A POWER CIRCUIT

(71) Applicant: SMA Solar Technology AG, Niestetal (DE)

(72) Inventors: Marcel Kratochvil, Kassel (DE); Raimund Thiel, Bad Zwesten (DE); Rainer Schmitt, Huenfeld (DE)

(73) Assignee: SMA Solar Technology AG, Niestetal (DE)

( * ) Notice: Subject to any disclaimer, the term of this patent is extended or adjusted under 35 U.S.C. 154(b) by 12 days.

(21) Appl. No.: 16/711,578

(22) Filed: Dec. 12, 2019

(65) Prior Publication Data

US 2021/0181264 A1 Jun. 17, 2021

(51) Int. Cl.
*G01R 31/40* (2020.01)
*H02H 1/00* (2006.01)

(52) U.S. Cl.
CPC .......... *G01R 31/40* (2013.01); *H02H 1/0015* (2013.01)

(58) Field of Classification Search
CPC .............................. G01R 31/40; H02H 1/0015
USPC .................... 324/764.01, 537, 500
See application file for complete search history.

(56) References Cited

U.S. PATENT DOCUMENTS

| 2003/0156367 | A1 | 8/2003 | Macbeth |
| 2006/0017445 | A1 | 1/2006 | Flock |
| 2008/0106832 | A1 | 5/2008 | Restrepo |
| 2008/0106250 | A1 | 8/2008 | Prior |
| 2014/0062500 | A1 | 3/2014 | Behrends |
| 2014/0119072 | A1 | 5/2014 | Behrends |
| 2014/0210485 | A1 | 7/2014 | Lang |
| 2016/0146857 | A1 | 5/2016 | Behrends |
| 2016/0276820 | A1 | 9/2016 | Olivas |
| 2019/0058338 | A1* | 2/2019 | Narla ..................... H02J 7/0031 |
| 2019/0067927 | A1* | 2/2019 | Emrani ................ H02H 1/0092 |
| 2019/0207375 | A1* | 7/2019 | Telefus .................... H02H 3/50 |

FOREIGN PATENT DOCUMENTS

| CN | 110504918 A | 11/2019 |
| DE | 102010063421 A1 | 6/2012 |
| DE | 102012104003 B3 | 10/2013 |
| WO | 9525374 A1 | 9/1995 |
| WO | 2018220223 A1 | 12/2018 |

OTHER PUBLICATIONS

International Search Report and Written Opinion dated Mar. 22, 2021 in connection with International Application PCT/EP2020/085742.

* cited by examiner

*Primary Examiner* — Giovanni Astacio-Oquendo

(74) *Attorney, Agent, or Firm* — Eschweiler & Potashnik, LLC

(57) ABSTRACT

A method of detecting a serial arc fault in a DC-power circuit includes injecting an RF-signal with a narrow bandwidth into the DC-power circuit and measuring a response signal related to the injected RF-signal in the DC-power circuit. The method further includes determining a time derivative of the response signal, analyzing the time derivative, and signaling an occurrence of a serial arc fault in the power circuit based on the results of the analysis. A system for detecting an arc fault is configured to perform a method as described before.

12 Claims, 3 Drawing Sheets

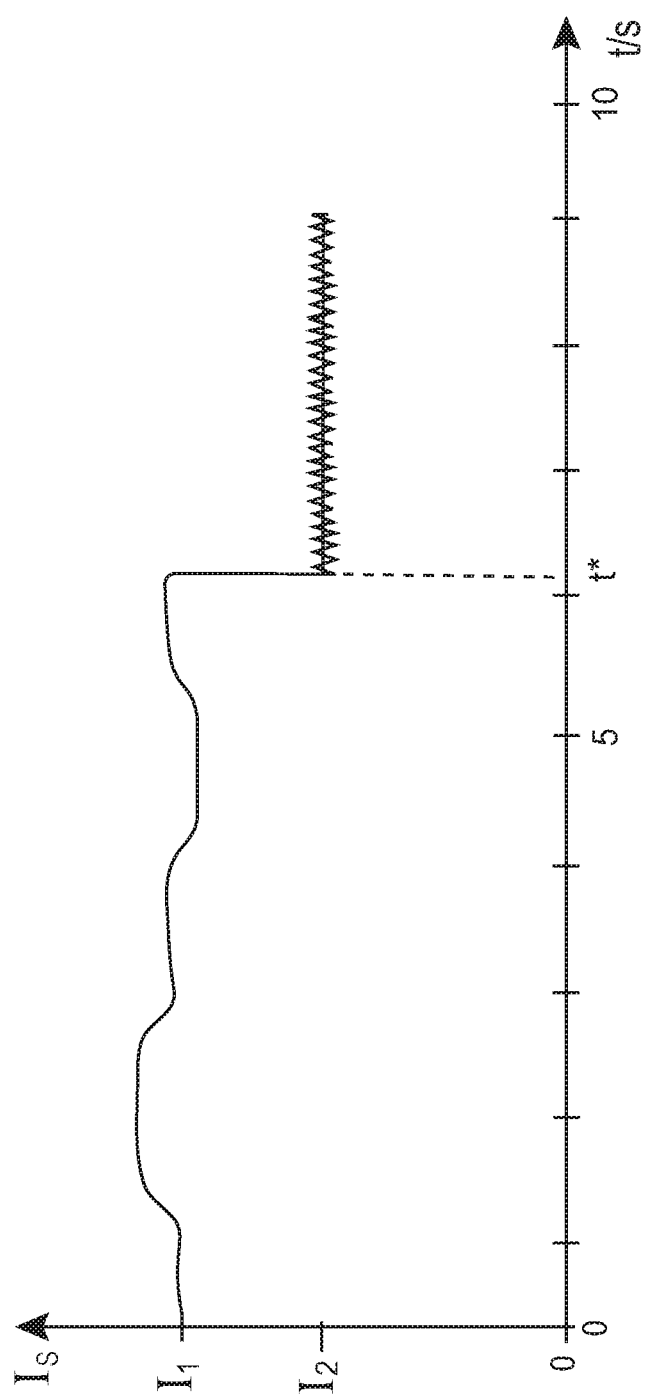

METHOD OF AND SYSTEM FOR DETECTING A SERIAL ARC FAULT IN A POWER CIRCUIT

FIELD

The disclosure relates to a method of detecting a serial arc fault in a power circuit, in particular within a photovoltaic system. The disclosure further relates to an arc fault detection system and a photovoltaic system comprising a corresponding detection system.

BACKGROUND

Power circuits, in particular DC (Direct Current)-power circuits that work with high voltages and high currents, for example in photovoltaic systems or systems providing off-grid power supply, are prone to the development of electric arcs. Electric arcs can, for example occur when a power line with a high current load is interrupted during maintenance or in case contacts at interconnectors are degraded. Other possible causes of arc faults, i.e. the occurrence of an electric arc in the power circuit, are corroded solder joints or broken insulators of the power lines. Arc faults are the most common fire causes in photovoltaic systems. This also reflects in the requirements for arc fault protection for photovoltaic systems as for example regulated by the National Electric Code (NEC) 690.11 of the United States of America.

A reliable arc fault detection method and system is therefore of major importance. On the one hand, for security reasons the existence of an arc fault has to be detected with a reliability as high as possible. On the other hand, the probability of an erroneous indication of a supposed arc fault has to be as low as possible, in particular, if an erroneous detection of an arc fault might lead to a shutdown of a photovoltaic system without the option to automatically restart it, as for example specified in the before mentioned NEC 690.11 code.

Electric arcs usually emit a broadband AC (Alternating Current)-signal in an RF (Radio Frequency)-frequency range. Detection systems for arc faults that are based on detecting a radio frequency signal in the power circuit are well established and, for example, known from document WO 95/25374. A problem associated with the detection of arc faults via their AC-current signature can arise from the weakness of the signal. In order to ensure that arc faults are assuredly detected, detection circuits with a high detection sensitivity are required. A down-side of high detection sensitivity could be an increased number of nuisance alarm situations, in which a noise signal, e.g. due to a disturbing RF-signal that is coupled into the detection circuit, is misinterpreted and wrongly assigned to the presence of an arc fault. Possible sources of disturbing signals are for example RF-radio transmitter, electric trains or trams passing by, electric or electronic devices with an insufficient electromagnetic shielding or interference suppression, or arcs in adjacent power systems.

Document US 2014/062500 A1 describes a further development of the detection of arcs based on RF-signals emitted by the arc. According to this document, an RF-signal is actively injected into the DC-power circuit and its frequency response is measured and analyzed. These method steps allow for an identification of a preferred frequency range which is afterwards used to detect the signal emitted by a burning arc. Albeit the detection is made more reliable, still high detection sensitivity is needed to be able to detect the RF-signal emitted by an arc. The vulnerability for nuisance alarm situations therefore persists.

It is thus desirable to create a method and system for reliably detecting arc faults in a power circuit. It is furthermore desirable to describe a photovoltaic system with a corresponding detection system.

SUMMARY

According to one embodiment of the disclosure, a method of detecting a serial arc fault in a DC-power circuit comprises injecting an RF-signal with a narrow band-width into the DC-power circuit and measuring a response signal related to the injected RF-signal in the DC-power circuit. The method further comprises determining a time derivative of the response signal, analyzing the time derivative, and signaling an occurrence of a serial arc fault in the power circuit based on the results of the analysis.

By measuring a response signal to an injected RF-signal rather than an RF-signal generated by an arc itself, the measurements are performed at a much higher signal level, thereby minimizing the susceptibility to nuisance alarm events. The detection via the time derivative further increases the reliability of the method since comparable changes in the response signal do not occur under normal operation conditions.

In one embodiment of the method, the acts are performed repeatedly in order to ensure continuous observation.

In another embodiment of the method, the injected RF-signal comprises a sine wave at a single frequency. If the injected signal has a very narrow band width due to the use of a single sine-wave, the response signal can be selectively amplified and observed with a high signal-to-noise ratio. Filters and/or PLL (phase locked loop) techniques can, for example, be used to discriminate the signal from background noise.

In a further embodiment of the method, the frequency of the RF-signal is chosen from a frequency range where an impedance of the DC-power circuit only shows a small dependency on operating conditions of the DC-power circuit. This way operation of the DC-power circuit does not interfere with or disturb the arc detection. If, for example, the DC-power circuit is the DC-power circuit of a photovoltaic (PV) system, a change of the solar irradiation and a following change of the point of operation of a PV-generator in the system would not lead to a change in the RF-response signal that could be interpreted as an occurrence of an arc. In one embodiment, the RF-signal has a frequency of at least 100 kilohertz (kHz). In one embodiment the RF-signal is 150 kHz+/−1 kHz. It is found, in particular in PV-systems, that the before mentioned condition (small dependency of impedance on operating conditions) is fulfilled for frequencies above 100 kHz.

In another embodiment of the method, the occurrence of an arc fault is signaled if the time derivative of the response signal exceeds a predetermined threshold. In a further embodiment, the occurrence of an arc fault is signaled if the time derivative of the response signal exceeds a predetermined threshold and if the response signal shows statistical fluctuations above a certain level afterwards. An amplitude of the statistical fluctuations could be determined and compared to a further threshold to evaluate whether the statistical fluctuations are above a certain level. The RF-response signal shows characteristic fluctuations during the presence of an electric arc. Observing these fluctuations after the (presumable) detection of an arc can be seen as a proof for correct arc detection. Accordingly, combining arc detection by observing rapid changes of the measured RF-signal and confirming this detected arc by observing fluctuations of the measured RF-signal on a short time scale provides an arc detection method with an even higher reliability.

According to another embodiment of the disclosure, an arc fault detection system comprises an injection circuit or means configured to inject an RF-signal into the DC-power circuit, an outcoupling circuit or means configured to measure an RF-response signal related to an RF-current flowing in the power circuit, and a control circuit operably connected to the outcoupling circuit or means. The arc fault detection system is configured to perform a method according to the disclosure. The same advantages as described in connection with the method arise.

In one embodiment of the arc fault detection system the injection circuit or means and/or the outcoupling circuit or means are additionally used for PLC-data transfer. PLC (power line communication) is a known method to transfer data in DC-power circuits. In PV-systems, for example, PLC can be used to exchange information between an inverter and a PV-generator, e.g. for control purposes. By combining the arc fault detection system with a PLC-system, components can be shared by both applications and the total number of components can be reduced.

According to another embodiment of the disclosure, a power system, in particular a photovoltaic power system, comprises an arc fault detection system according to the disclosure. The same advantages as described in connection with the method and arc fault detection system arise.

BRIEF DESCRIPTION OF THE DRAWINGS

The disclosure is now described in more detail and will be fully understood with reference to the following detailed description in conjunction with the drawings. The drawings show:

FIG. 3 illustrates an example of a time dependence of a measured RF-response signal in a photovoltaic system.

DETAILED DESCRIPTION

Figure 1:
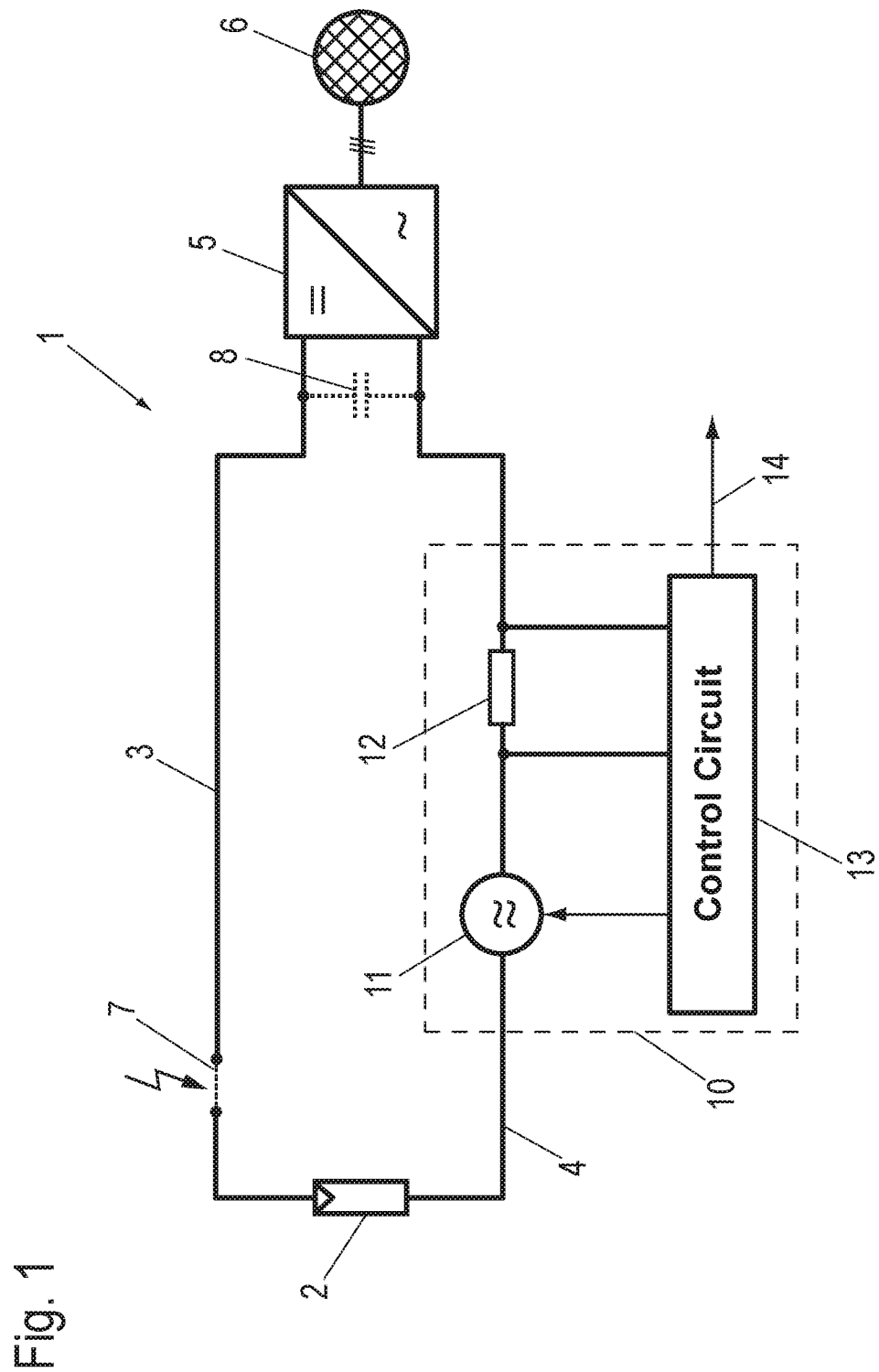
FIG. 1 a schematic wiring diagram of a photovoltaic system with an arc fault detection system.

FIG. 1 shows a photovoltaic system 1, in the following abbreviated as PV-system 1, in a schematic wiring diagram as an example of a DC (Direct Current)-power circuit. The PV-system 1 comprises a photovoltaic generator 2 (PV-generator 2) that is connected to an inverter 5, e.g. a DC/AC (Direct Current/Alternating Current)-converter, by way of DC-power lines 3, 4. The inverter 5 is connected to a power grid 6 on its AC-side.

The power grid 6 can either be a private or a public power grid. By way of example, the power grid 6 is a 3-phase system and the inverter 5 is designed to feed in all 3-phases. However, the disclosure can be realized with a power grid and/or inverter operating with any number of phases, for example, one or two phases.

Also by way of example, the PV-generator 2 is symbolized by the circuit symbol of a single photovoltaic cell. In a realization of the shown PV-system 1, the PV-generator 2 can, for example, be a single photovoltaic module (PV-module) that itself comprises a plurality of photovoltaic cells. In another embodiment, the PV-generator 2 can comprise a plurality of PV-modules that, for example, are connected in series and form a so-called string. Furthermore, a parallel connection or a combined serial/parallel connection of PV-modules is possible.

A possible serial arc fault 7 that can occur in the power circuit formed by the PV-generator 2, the power lines 3, 4 and the input stage of the inverter 5 is depicted in FIG. 1. The serial arc 7 is electrically in series with the PV-generator 2 and is, by way of example, located in power line 3. The serial arc 7 could also be located in power line 4 or within the PV-generator 2 or at a connection of the power lines 3, 4 with the PV-generator 2 and/or with the inverter 5.

The PV-system 1 of FIG. 1 is equipped with an arc fault detection system 10 for detecting serial arcs, e.g. the shown serial arc 7. The arc fault detection system 10 comprises signal injection circuit or means 11 for providing an RF (radio frequency)-signal that is injected into the DC-power circuit of the PV-system 1. In the schematic diagram of FIG. 1 the signal injection circuit or means 11 is connected in series with the other components of the DC-power circuit and therefore carries a DC-current flowing in the DC-power circuit. The signal injection circuit or means 11 can e.g. comprise a signal generator circuit and an RF-transformer with a primary side and a secondary side. The primary side of the transformer is connected to the signal generator circuit. The secondary side of the transformer has a low DC-resistance and is looped into the DC-power circuit.

The arc fault detection system 10 further comprises an outcoupling circuit or means 12 for coupling out an RF-signal from the DC-power circuit. The outcoupling circuit or means can e.g. again be realized by a transformer with a primary side and a secondary side. In this case, the primary side of the transformer shows a low DC-resistance and is looped into the power circuit. It would also be possible to use a resistor ("shunt") or another component with a defined impedance as the outcoupling circuit or means 12. In further embodiments, other known-types of outcoupling circuits or means can be used, for example Hall sensors. The purpose of the outcoupling circuit or means 12 is to couple an RF-signal out of the DC-power circuit to enable an analysis of an RF-current flowing in the DC-power circuit.

It is noted that all-known circuits or means that can be used to either inject an AC-signal into a high current DC-circuit and/or to pick up an RF-signal component present in a DC-circuit can be utilized in connection with the signal injection circuit or means 11 and/or the outcoupling circuit or means 12. In particular, the outcoupling circuit or means 12 can be realized as a pickup-coil which is assigned to the respective DC-power line 3, 4. The pickup-coil can, for example, be configured as a Rogowski-coil. The primary side of the outcoupling circuit or means 12 then could be a cable of the DC-power line 3, 4 or a printed circuit board track within the inverter 5.

The arc fault detection system 10 further comprises a control circuit 13 that controls the signal injection circuit or means 11 and analyzes the RF-signal provided by the outcoupling circuit or means 12. Control of the signal injection circuit or means 11 might comprise controlling a signal amplitude and/or frequency of the RF-signal injected into the DC-power circuit. The control circuit 13 provides an output signal line 14 that signals a detected arc. It is noted that the presence of a dedicated output signal line 14 is just one example embodiment. An output signal could also be provided via a wired and/or wireless data connection.

In the embodiment shown in FIG. 1 the arc fault detection system 10 uses dedicated components like the signal injection circuit or means 11 and the outcoupling circuit or means 12 exclusively for arc detection. In another embodiment the signal injection circuit or means 11 and the outcoupling circuit or means 12 are also used for other purposes, in particular for a data exchange over the DC-power lines 3, 4. Data transfer via DC-power lines is known as PLC (power line communication). It is known to use PLC in PV-systems to exchange information between an inverter and a PV-generator, e.g. for control purposes. By combining the arc fault detection system 10 with a PLC-system, components can be shared by both applications and the total number of components can be reduced.

Details of a method for detecting an arc fault are described in the following with reference to FIGS. 2 and 3.

Figure 2:
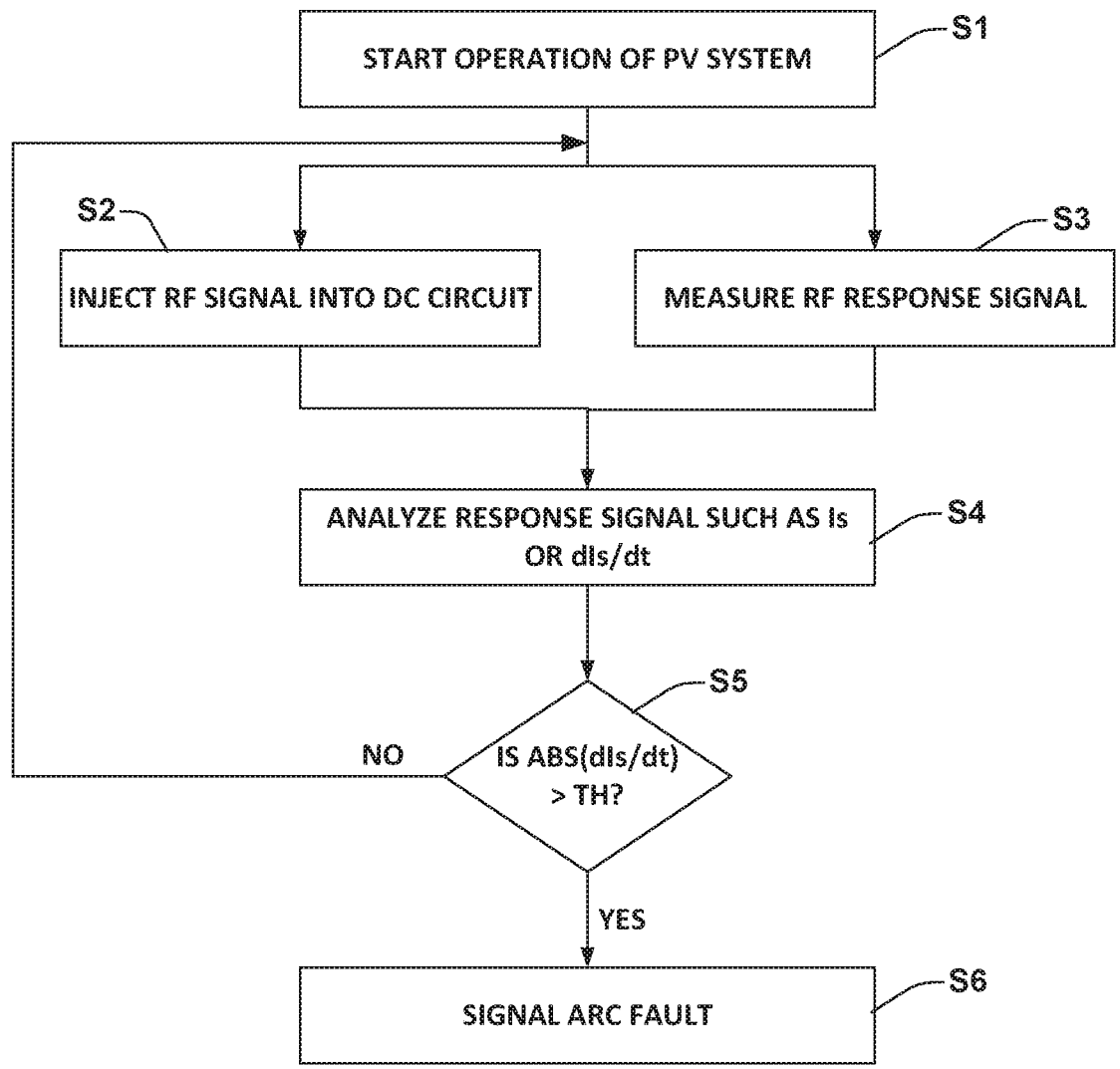
FIG. 2 a flow chart of an embodiment of a method for detecting the presence of an electric arc in a power circuit.

FIG. 2 shows a flow chart of a method for detecting an electric arc in a power circuit. The method can, for example, be performed by a detection system 10 as shown in FIG. 1. Without any limitation, it will therefore be described by way of example with reference to FIG. 1. The method is particularly suited for the detection of a serial arc, e.g. like the serial arc 7 shown in FIG. 1.

In a first act S1, the power circuit, for example the PV-system 1 shown in FIG. 1, starts its operation. In case of the PV-system 1 of FIG. 1, this for example regularly occurs in the morning, when the intensity of the sunlight increases and the electric power produced by the PV-generator 2 is sufficient to start operation of the inverter 5. As mentioned before, in one embodiment the detection system 10 could be integrated into the inverter 5. The functionality of the control circuit 13 could then be provided by a central control circuit of the inverter 5. Alternatively, a separate control circuit 13 could be used which is triggered to perform the following acts by the control circuit of the inverter 5 after the inverter 5 has started its operation and performs its internal set up procedures.

In a second act S2, an RF-signal is generated by a signal generator circuit and injected into the DC-power circuit via the injection circuit or means 11. In one embodiment of the example of FIG. 1, a signal generator circuit of the injection circuit or means 11 or associated with the injection circuit or means 11 generates a sine-signal of a particular frequency with a single frequency component, i.e. a signal with a narrow frequency spectrum. The signal can have a frequency in a range of a few tens of kilohertz (kHz) to several hundreds of kilohertz. In one embodiment, the frequency is higher than 100 kHz.

The RF-signal injected into the DC-power circuit leads to an RF-current flowing in the DC-power circuit. In case an input-stage of the inverter 5 has a high impedance for RF-signals, a capacitor 8, depicted by a dashed-line in FIG. 1, might be connected in parallel to the input of the inverter 5. This capacitor allows an RF-current to flow in the power circuit. Often, a suitable capacitor is already present in the input-stage of an inverter, e.g. as part of an EMC (electromagnetic compatibility)-filter.

In an act S3 that is performed in parallel to act S2, a response signal within the power circuit that is related to the injected RF-signal is measured via the outcoupling circuit or means 12. The measurement itself is performed in the control circuit 13 in the embodiment shown in FIG. 1. In alternative embodiments, the measurement can be performed by or supported by an additional circuit that e.g. comprises a (pre-) amplifier and/or filter. A measured voltage amplitude of the RF-signal corresponds to an RF-current $I_s$ flowing in the DC-power circuit. Given that the amplitude of the RF-signal in-coupled into the DC-power circuit is constant, the RF-current $I_s$ reflects an impedance of the DC-power circuit at the frequency of the RF-signal.

FIG. 3 shows an example of a time dependence of a measured RF-current $I_s$ in the DC-power circuit. The measured signal is shown in form of a current curve 20 in a diagram that depicts a root mean square (RMS)-value of the measured current signal $I_s$ on a vertical axis as a function of a time t measured in seconds on a horizontal axis. As an example, 10 seconds of the continuously measured curve 20 are shown in the diagram of FIG. 3.

From a time t=0 seconds (s) to approximately t=65 the measured RF-current $I_s$ is more or less constant with slight slow variations. Its value is around a first current value $I_1$. The slight variations in the current $I_s$ arise from a change of the working point, also named point of operation, of the PV-generator 2. Working point variations stem from a change in the irradiation situation. The inverter 5 of the embodiment of FIG. 1 comprises a tracking mechanism that tries to operate the photovoltaic generator 2 under all or at least most circumstances at its most efficient working point for a given solar irradiation. The fact that the change in the point of operation of the photovoltaic generation 2 reflects in the measured RF-current $I_s$ is due to the fact that the impedance of the DC-power circuit slightly changes with a change of the point of operation. The influence of the point of operation can be minimized by choosing a signal frequency in a frequency range where this influence is less pronounced. Investigations show that the influence usually becomes smaller at higher frequencies, in particular at frequencies above 100 kHz.

At a time t* an electric arc evolved in the DC-power circuit. The evolution of the arc leads to an immediate drop of the impedance in the DC-power circuit, which results in an according drop of the measured RF-current $I_s$. In the diagram of FIG. 3 the RF current $I_s$ drops from the first current value $I_1$ to a second current value $I_2$ that is almost 40% smaller than the first current value $I_1$. At t>t* the measured RF-current $I_s$ keeps its mean value around this second current value $I_2$. Due to the stochastic processes in a burning arc the RF-current $I_s$ is less stable than it was before the arc evolved. This results in current fluctuations of the RF-current $I_s$ that occur on a relatively short time scale and in particular on a time scale that is much shorter than the variations due to the tracking mechanism that was observed for t<t*.

According to one embodiment of the present disclosure, the rapid change in the measured RF-current $I_s$ is used to detect the evolution of an arc in the DC-power circuit.

Therefore, in a next act S4 of FIG. 2, the measured RF-current $I_s$ is analyzed and in particular its first time derivative is determined. The absolute value of the time derivative, i.e. $|dI_s/dt|$, is determined.

In a next act S5 the absolute value of the time derivative is compared to a predefined threshold. If the time derivative of the measured RF-current signal $I_s$ exceeds the threshold, the method branches to an act S6, in which an arc fault is signalled. The signalling can, for example, occur via the output line 14 in the embodiment of FIG. 1. The output line 14 can be connected to a visual and/or acoustical alarm indicator informing about the detected occurrence of an electric arc in the DC-power circuit. In the example shown the method finishes after the signalling.

If the time derivative of the RF-current signal $I_s$ did not exceed the threshold at act S5, the method branches back to acts S2/S3, thereby continuing the method.

In an alternative embodiment the method could further comprise an act of extinguishing the detected arc, for example by advising the inverter 5 of the photovoltaic system 1 to interrupt any DC-currents flowing in the DC-power circuit. An interruption of the DC-current will extinguish the burning serial electric arc 7. In a further act the method could wait for a manual restart signal before operation would be resumed and the method would start again at act S1 of the diagram of FIG. 2.

In the embodiment described before the sudden drop in the measured RF-current $I_s$ was used to determine the evolution of an electric arc in the DC-power circuit. As described before and as apparent from FIG. 3, the current curve 20 shows characteristic fluctuations during the presence of an electric arc. Observing these fluctuations after the (presumable) detection of an arc can be seen as a proof for correct arc detection. Accordingly, combining arc detection by observing rapid changes of the measured current and confirming this detected arc by observing fluctuations of the measured current $I_s$ on a short time scale provides an arc detection method with a very high reliability.

It is finally noted that the foregoing description and the drawings are examples and not restrictive and that the disclosure is not limited to the disclosed embodiments. Other variations to the disclosed embodiments can be understood and effected by those skilled in the art from a study of the drawings, the disclosure, and the appended claims.

The invention claimed is:

1. A method of detecting a serial arc fault in a DC-power circuit, the method comprising:
    a) injecting an RF-signal into the DC-power circuit;
    b) obtaining a response signal related to the injected RF-signal in the DC-power circuit;
    c) determining a time derivative of the response signal;
    d) analyzing the time derivative of the response signal; and
    e) signaling an occurrence of a serial arc fault in the DC-power circuit depending on results of the analysis.

2. The method of claim 1, wherein acts a) to e) are performed repeatedly.

3. The method of claim 1, wherein the injected RF-signal comprises a sine wave at a single frequency.

4. The method of claim 3, wherein a frequency of the RF-signal is chosen from a frequency range where an impedance of the DC-power circuit only shows a small dependency on operating conditions of the DC-power circuit.

5. The method of claim 3, wherein the RF-signal has a frequency of at least 100 kHz.

6. The method of claim 1, wherein the occurrence of an arc fault is signaled if the time derivative of the response signal exceeds a predetermined threshold.

7. The method of claim 1, wherein the occurrence of an arc fault is signaled if a time derivative of the response signal exceeds a predetermined threshold and if the response signal shows statistical fluctuations above a predetermined level.

8. The method of claim 7, wherein an amplitude of the statistical fluctuations is determined and compared to a further threshold to evaluate whether the statistical fluctuations are above a predetermined level.

9. An arc fault detection system for a DC-power circuit, comprising:
    an injection circuit configured to inject an RF-signal into the DC-power circuit;
    an outcoupling circuit configured to extract an RF-response signal related to an RF-current flowing in the DC-power circuit;
    a control circuit operably connected to the outcoupling circuit;
    wherein the control circuit is configured to determine a time derivative of the RF-response signal, to evaluate the time derivative, and to selectively signal an occurrence of an arc fault in the DC-power circuit based on the evaluated time derivative.

10. The arc fault detection system of claim 9, wherein the injection circuit comprises a signal generator circuit configured to generate a sine wave at a single frequency.

11. The arc fault detection system of claim 9, wherein the injection circuit and/or the outcoupling circuit are additionally used for a PLC-data transfer.

12. A method of detecting a serial arc fault in a DC-power circuit, comprising:
    injecting an RF-signal into the DC-power circuit;
    obtaining a response signal related to the injected RF-signal in the DC-power circuit; and
    selective signaling an occurrence of a serial arc fault in the DC-power circuit based on the response signal.

* * * * *